United States Patent [19]

Khaitan

[11] 4,096,398
[45] Jun. 20, 1978

[54] MOS OUTPUT BUFFER CIRCUIT WITH FEEDBACK

[75] Inventor: Basant K. Khaitan, San Jose, Calif.

[73] Assignee: National Semiconductor Corporation, Santa Clara, Calif.

[21] Appl. No.: 771,145

[22] Filed: Feb. 23, 1977

[51] Int. Cl.$^2$ .................. H03K 5/08; H03K 17/60; H03F 3/16; H03F 3/26
[52] U.S. Cl. .................. 307/237; 307/209; 307/270; 307/DIG. 1; 330/269
[58] Field of Search .............. 307/205, 208, 209, 214, 307/215, 237, 264, DIG. 1, 270, 254, 251; 328/169–172; 330/269, 277, 22, 35, 40

[56] References Cited

U.S. PATENT DOCUMENTS

| | | | |
|---|---|---|---|
| 3,648,071 | 3/1972 | Mrazek | 307/237 |
| 3,700,981 | 10/1972 | Masuhara | 307/205 X |
| 3,736,522 | 5/1973 | Padgett | 330/35 |
| 3,980,898 | 9/1976 | Priel | 307/208 X |
| 4,019,068 | 4/1977 | Bormann | 307/209 X |
| 4,032,800 | 6/1977 | Droscher et al. | 307/DIG. 1 X |
| 4,037,114 | 7/1977 | Stewart et al. | 307/209 X |

FOREIGN PATENT DOCUMENTS 2,250,554   4/1974   Germany .................. 307/DIG. 1

OTHER PUBLICATIONS

Gardner, "FET Off-Chip Driver Clamping", IBM Tech. Discl. Bull., vol. 16, No. 1, pp. 275–276, 6/1973.

Primary Examiner—Larry N. Anagnos
Attorney, Agent, or Firm—Gail W. Woodward

[57] ABSTRACT

A PMOS output buffer circuit permits interfacing directly with TTL, CMOS, and NMOS. A feedback circuit incorporated into the buffer acts to limit the drive current for negative potential output excursions. The feedback circuit is sensitive to device parameters that vary with processing so that the output characteristics can be set independently of process variables.

6 Claims, 6 Drawing Figures

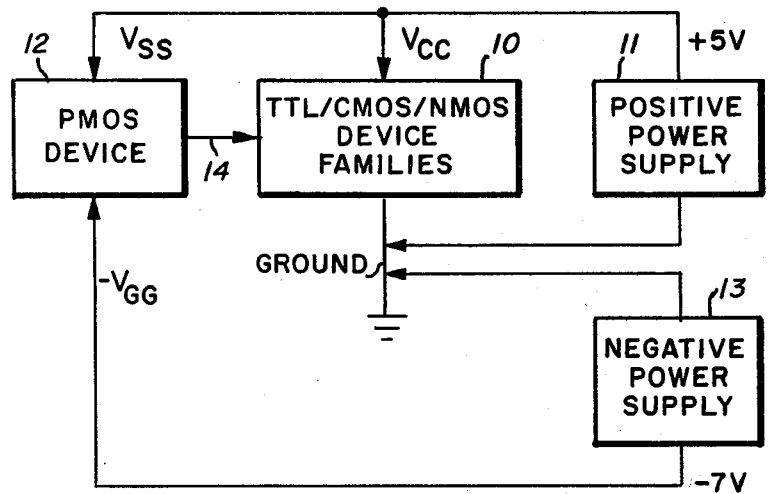
Fig_1 (PRIOR ART)
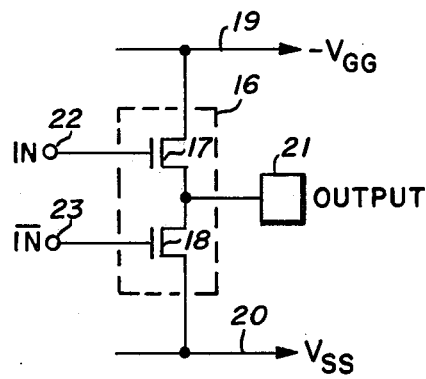
Fig_2 (PRIOR ART)
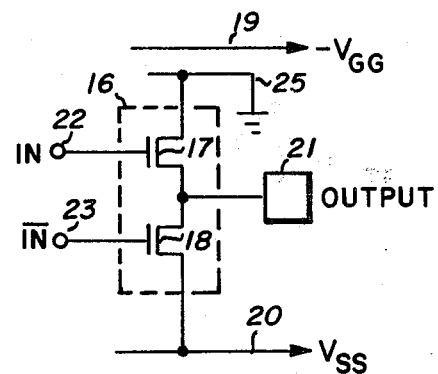
Fig_3 (PRIOR ART)
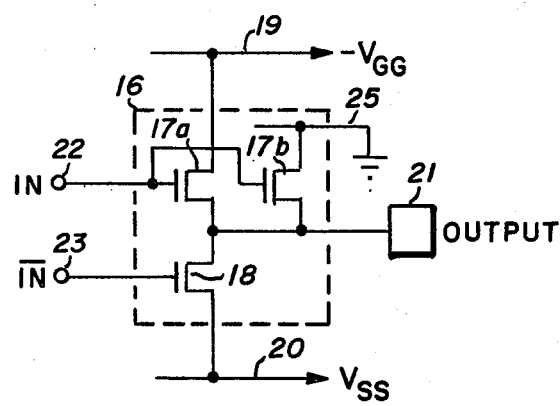
Fig_4 (PRIOR ART)

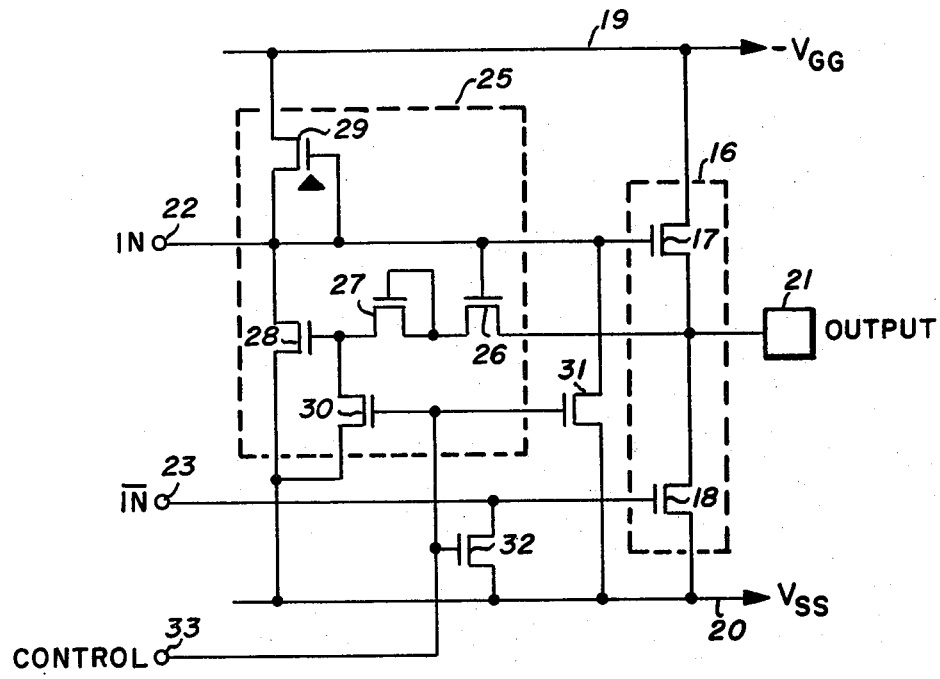
Fig_5
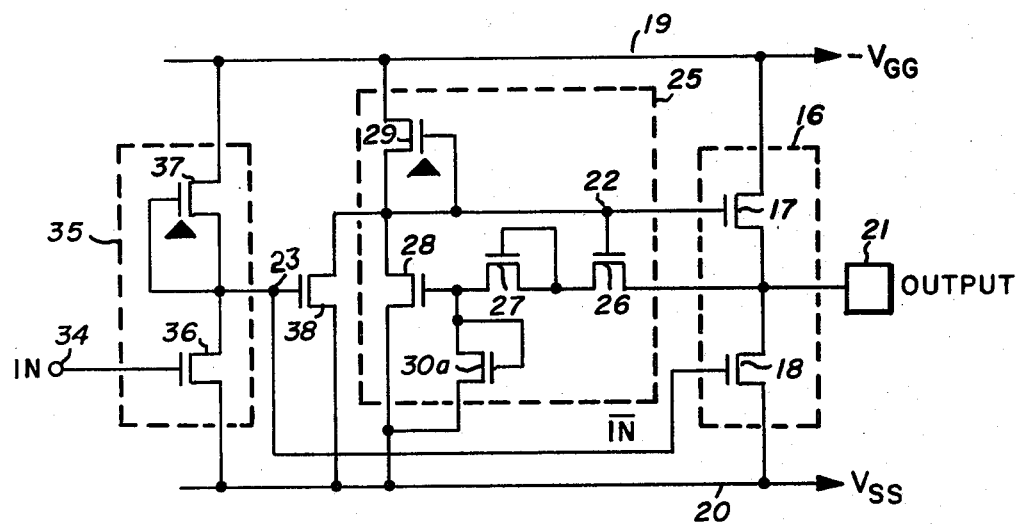
Fig_6

MOS OUTPUT BUFFER CIRCUIT WITH FEEDBACK

BACKGROUND OF THE INVENTION

The invention relates to p-channel metal oxide semiconductor (PMOS) devices and is specifically directed to output circuits that are designed to interface directly with, or drive, other devices such as the families known as N-channel metal oxide semiconductor (NMOS) devices, transistor-transistor logic (TTL) devices, and complementary metal oxide semiconductor (CMOS) devices.

The NMOS, TTL, and CMOS device families have developed a circuitry tradition wherein a single positive power supply, referenced to ground potential is used to operate the devices. Typically a 5-volt supply is used and an input near +5 volts constitutes a logic "1", while an input near zero or ground potential constitutes a logic "0". Furthermore input voltages of less than approximately 0.6 volt negative with respect to ground may damage the devices or may cause malfunction due to parasitic active elements.

PMOS circuitry has proven to be very useful particularly in large scale integration (LSI) where large numbers of devices and circuit functions can be incorporated into a single chip. However, in PMOS circuits it has been found desirable to operate with voltages in excess of 5 volts. The chip substrate is connected to the positive supply terminal as the most positive circuit element designated $V_{SS}$. All devices are operated at a relatively negative potential designated $-V_{GG}$. Extending the positive logic convention to these devices as it is used in the above-mentioned other families, in PMOS a logic "0" is a negative potential with respect to $V_{SS}$ and a logic "1" is a potential near $V_{SS}$.

Clearly there will be difficulties associated when PMOS devices are coupled to the other device families. In the prior art such coupling is often done using so called interface circuitry which provides the desired signal conversion. In some cases the PMOS output circuitry is operated with respect to a "ground" terminal or reference. This latter approach is undesirable because it adds an extra pin to the IC package and imposes design restraints on the output devices that are difficult to meet in practice.

SUMMARY OF THE INVENTION

It is an object of the invention to provide a PMOS output circuit that is compatible with the drive requirements of other device families, without resorting to "ground" connections.

It is a further object of the invention to provide a PMOS output circuit that can directly drive TTL, CMOS, and NMOS circuits in a manner that avoids excessive currents.

It is a still further object to provide a PMOS output circuit that is current limited using circuitry that is self compensating in terms of the PMOS process.

These and other objects are achieved in a PMOS output circuit configured as follows. A pair of transistors are coupled between $V_{SS}$ and $V_{GG}$ and their gates are driven in complementary fashion from conventional circuitry. Their juncture comprises the circuit output terminal. The transistor coupled to $V_{GG}$ has its gate coupled to a drive limiting feedback circuit that limits the output current when the output terminal approaches below ground potential.

When the transistor coupled to $V_{SS}$ is turned on the feedback circuit acts to disconnect. When the transistor coupled to $V_{GG}$ is turned on the feedback circuit is turned on and the gate potential limited at a level that is related to the device parameters which vary with processing. This arrangement permits designing a circuit that will limit the output sinking current in PMOS devices to a particular value that will not vary significantly with process variables.

BRIEF DESCRIPTION OF THE DRAWING

FIG. 1 is a block diagram showing the interfacing of PMOS devices with other device families.

FIG. 2 is a schematic diagram of a conventional PMOS output stage;

FIG. 3 is a schematic diagram of a prior art PMOS output stage designed to interface with another device family;

FIG. 4 is a schematic diagram of another prior art PMOS output stage designed to interface with another device family;

FIG. 5 is a schematic diagram of a PMOS output stage using the feedback circuit of the invention and capable of tri-state operation; and FIG. 6 is a schematic diagram of a static PMOS output stage and driver using the feedback circuit of the invention.

DESCRIPTION OF THE INVENTION

Referring to FIG. 1, the basic problem is outlined. Block 10 relates to several families of devices well-known in the prior art in which operation from a power supply 11 is shown as having the negative terminal grounded. The positive terminal, having for example a 5 volt potential, operates the devices. Such families as TTL, CMOS, and NMOS all operate with such a positive $V_{CC}$ power supply and therefore interface well one with another.

Such is not the case with PMOS devices in which the semiconductor substrate is the most positive point in the circuit labeled $V_{SS}$. The PMOS devices in block 12 operate from a negative potential $V_{GG}$, with respect to $V_{SS}$, supplied by power supply 13. Thus $V_{SS} - V_{GG}$ is, for example, 12 volts, a level suitable for PMOS devices.

PMOS technology has proven extremely capable of producing a large number of functional circuits in a single semiconductor chip. Such large scale integration permits economical manufacturing of electronic system heretofore regarded as impractically complex. In view of the availability of the other device families it is often considered desirable to interconnect the various families. In FIG. 1 the interconnection or interface is shown as line 14. In the past such interfacing has been accomplished by means of special circuits capable of dealing with one form of input and converting it to a form suitable for operating the devices to be interfaced. Ideally the PMOS output circuits will be designed to interface directly via line 14 without any intervening circuits.

FIG. 2 is a schematic diagram of a conventional prior art PMOS output stage 16. A pair of p-channel enhancement FET devices 17 and 18 are coupled in series across the power supply terminals 19 for $-V_{GG}$ and 20 for $+V_{SS}$. These devices form a conventional inverter from input terminal 23 to output terminal 21 which would ordinarily be available as an IC pad as designated by the square element outline. Input terminal 22 is typically provided with complementary data input and thus would comprise a non-inverting input. Two inputs are present so that output stage 16 can if desired be driven into a high impedance state for tri-state operation. If inputs 22 and 23 are both operated to turn devices 17 and 18 off, terminal 21 will be "floating" at high impedance thereby permitting paralleling a number of such circuits on a single bus.

As the circuit of FIG. 2 is supplied with input data, output 21 will be driven from close to $-V_{GG}$ to close to $+V_{SS}$. If this circuit were coupled directly to a TTL gate as shown in FIG. 1 the positive polarity data excursions would present no problem. However, the negative excursions, which would attempt to approach $-V_{GG}$ in the example given, would cause problems. TTL gates are normally clamped to ground by means of input protection diodes. When the input is driven more than about 0.6 volt negative, the diode becomes forward biased and very conductive. For this condition excessive sink current can flow in output stage 16 and this current is productive of no useful result.

FIG. 3 shows a prior art circuit designed to avoid the above problem. Output stage 16 is coupled between $+V_{SS}$ and ground 25 so that output terminal 21 will swing inside the limits of +5 and 0 volts. However, $-V_{GG}$ must be supplied to other PMOS circuitry. This circuit will properly drive the TTL circuits and will avoid the excessive sink currents. However, the output stage must operate at lower supply voltage (5 volts as opposed to 12) thereby necessitating much larger device areas, often unjustifiable to implement in LSI devices. Furthermore, a separate ground pin 25 is required in the IC construction.

FIG. 4 is a prior art compromise circuit. Output stage 16 now has two sinking transistors 17a and 17b coupled to $-V_{GG}$ and ground respectively. The area of transistor 17a is designed to make it capable of sinking the currents required to drive the inputs of the interface device families. Transistor 17b is a relatively large area device and is present to provide clamping of the output terminal at a potential near ground potential. Such clamping action occurs because of the voltage dividing action between transistors 17a and 17b. Thus the circuit of FIG. 4 requires an additional ground pin and larger area PMOS IC's.

FIGS. 2 through 4 show complementary data drive inputs and describe logical output states of 0 and 1 for which transistor 17 and 18 conduct respectively. In many applications a third state is invoked for what is called tri-state operation. The third state is a so called "high-impedance" state in which both transistors 17 and 18 are turned off. This state can be achieved by applying a logic 1 to both inputs 22 and 23. Since neither output transistor conducts, terminal 21 will float at high impedance. This state is desired where a number of similar devices are connected to a common bus. In tri-state operation only the device turned on will set the logic state of the bus and the off devices will not impose loading of the bus.

FIG. 5 is a schematic diagram of a circuit employing the invention. The output stage 16 is conventional, using transistors 17 and 18 driven from complementary data inputs 22 and 23, to provide data output to terminal 21.

A feedback amplifier is shown inside dashed outline 25. The input connection to amplifier 25 is from the output terminal 21 and the output of amplifier 25 couples to the gate electrode of transistor 17. Four enhancement and one depletion type transistor are used in amplifier 25. Transistor 26 acts as a switch so that amplifier 25 is active only when transistor 17 is turned on by a logic 0 at terminal 22. Transistor 27 is connected to act as a unilateral conductive resistance. When transistor 26 is turned on, transistor 27 will pull the gate of transistor 28 to about one threshold voltage positive with respect to the potential present at terminal 21. Transistor 28 acts as a linear inverting amplifier with transistor 29 providing the depletion load function.

When the circuit is in the logic 0 state, transistor 29 will pull the gate of the transistor 17 toward $-V_{GG}$. However, conduction in transistor 28 will hold the gate of transistor 17 at some potential between $-V_{GG}$ and $V_{SS}$. The circuit 25 acts to clamp the potential at terminal 21 at a potential that will be a function of transistor threshold and, if a load is coupled to terminal 21 that pulls it toward $V_{SS}$, will act to limit the current through transistor 17. Such current limiting action is maximum when a device of the CMOS or NMOS families is connected to terminal 21. The output voltage in this case is clamped to about 0.6 volt below ground.

When transistor 17 is on, the gate of transistor 28 will be about one threshold above −0.6 volt and the potential at the gate of transistor 17 can be controlled by the rationing of transistors 28 and 29. This ratio is adjusted to limit the sinking current in transistor 17 to a selected value. Since the area ratios of the transistors will be fixed in the design layout, and Mobility factor tends to cancel in transistors 28 and 29, the current value will be controlled. If threshold voltage varies as a function of the manufacturing process, the variation in $V_T$ of transistor 17 will be compensated by the same variation in transistor 27. At any greater potential than −0.6V at the output terminal 21, larger sinking currents can flow.

From the above, it can be seen that transistors 28 and 29 operate as a linear amplifier set to operate at its conduction knee by a biasing potential operating at a $V_T$ level shift from the output potential. If this amplifier is designed to display moderate gain, the control function can be made to operate effectively over fairly wide limits.

Transistor 30, shown as part of amplifier 25, and transistors 31 and 32 are present to provide tri-state operation. When a logic 0 is present at control terminal 33, transistors 30 - 32 will be turned on and this will pull the gates of transistors 28, 17, and 18 toward $V_{SS}$ thereby turning them off. This is the off or high-impedance state of tri-state operation and terminal 21 will float. Clearly transistors 31 and 32 are present to disable transistors 17 and 18 respectively. Because of the unilateral conduction characteristic of transistor 27, it can be seen that the gate electrode of transistor 28 can have a trapped charge following the end of a logic 0 output state. Due to the possibility of a changing environment around the PMOS device and for noise consideration, it is desirable to discharge this trapped charge. This is done by turning transistor 30 on while the output terminal 21 is in the high impedance state. Circuitwise, transistor 30 performs no active function because it is turned off when normal operation is present as would be the case when a logic 0 is present at control terminal 33.

FIG. 6 is a schematic diagram showing one means for implementing a static version of FIG. 5. In this circuit the tri-state feature is not present. Output stage 16 and feedback amplifier 25 are as shown in FIG. 5 except that transistor 30a has its gate returned to its drain. In the event that charge accumulates at the gate of transistor 28, transistor 30a, acting as a high value resistor, will leak off the charge.

The logic input at terminal 34 drives an inverter 35 which is made up of transistor 36 and depletion load transistor 37. The output of inverter 36 is $\overline{\text{IN}}$ at circuit node 23. Transistor 38 acts as a cascade inverter using transistor 29 as a depletion load to drive circuit node 22 with IN data. Thus FIG. 6 employs a single data input and drives output terminal 21 with a sinking current limited characteristic so that all forms of logic circuits are compatible.

EXAMPLE

The circuit of FIG. 5 was implemented using p-channel transistors. With the exception of depletion load 29 all transistors were of the enhancement variety. The following chart lists the transistor Width/Length ratios in mils. Transistors 31 and 32 are omitted because they are off when he circuit is active and they play no part in the invention.

| TRANSISTOR | W/L (mils) |
|---|---|
| 17 | 20/0.3 |
| 18 | 10/0.25 |
| 26 | 0.3/0.3 |
| 27 | 0.4/0.3 |
| 28 | 3/0.3 |
| 29 | 3/0.6 |
| 30 | 0.2/0.25 |

The circuit thus implemented was operated from a $V_{GG}$ of $-7$ volts and $V_{SS}$ was 5 volts to give a potential of 12 volts across the PMOS device. The circuit was used to successfully drive TTL, CMOS, NMOS logic gates operating between +5 volts and ground (zero volts). The maximum sinking current was observed to be 6 ma. This is a suitable drive for TTL levels. In one case disabling amplifier 25 resulted in a 20 ma sinking current. Little change was observed when the circuits manufactured had different device parameters resulting from process variables. The inclusion of the current limiting circuits did not affect the switching time of the PMOS circuits.

While the foregoing example and description detailed PMOS circuitry, the invention can if desired be applied to NMOS circuitry. In this case it is only necessary to change the polarity of the $V_{GG}$ to $V_{SS}$ potential and the drive logic voltage polarity.

The invention has been described and a working embodiment detailed. Clearly there will be alternatives and equivalents that would occur to a person skilled in the art. Accordingly, it is intended that the scope of the invention be limited only by the claims that follow.

I claim:

1. An MOS transistor universal output circuit capable of operating with both positive and negative power supplies connected thereto and driving directly coupled logic gates that are adapted to operate using only a positive power supply, said circuit comprising:
   an output stage including a pair of MOS output transistors one coupled to act as a current source and one coupled to act as a current sink to an output terminal;
   means for driving said pair of output transistors with complementary logic signals; and
   means for limiting current flow in said output transistor coupled to act as a current sink, said means for limiting including amplifier means having an input terminal coupled to said output stage output terminal and an output terminal coupled to said driving means, and switching means operable to disable said amplifier means when said current sink transistor is turned off and to enable said amplifier means when said current sink transistor is turned on.

2. The circuit of claim 1 wherein said amplifier means further include:
   level shift means having a shift value that varies with the transistor manufacture in a manner similar to shift in current sink transistor characteristics whereby the current flowing in said sink transistor does not vary with manufacturing variables.

3. An MOS transistor output circuit having an output terminal, data and complementary data drive means, and terminals adapted for connection to power supply potentials that include positive and negative potentials with respect to ground potential, said circuit comprising:
   a first enhancement transistor having its source and drain terminals coupled between said output terminal and said positive power supply terminal and its gate terminal coupled to said complementary data drive means;
   a second enhancement transistor having its source and drain terminals coupled between said output terminal and said negative power supply terminal and its gate electrode coupled to said data drive; and
   inverting amplifier means having its input coupled to said output terminal and its output coupled to said data drive, said inverting amplifier means including a third enhancement transistor having its source and drain terminals coupled between said positive power supply terminal and said data drive means and means coupling its gate electrode to said output terminal, a depletion transistor with its gate coupled to its source and its source and drain terminals coupled between said data drive means and said negative power supply terminal, and a fourth enhancement transistor having its source and drain terminals series coupled between said output terminal and said gate terminal of said third enhancement transistor and its gate terminal coupled to said data drive means.

4. The circuit of claim 3 wherein said inverting amplifier means further comprise:
   a fifth enhancement transistor having its gate terminal coupled to its drain terminal and its source and drain terminals series coupled between said output terminal and said gate terminal of said third enhancement transistor.

5. The circuit of claim 4 wherein said inverting amplifier means further comprise:
   a sixth enhancement transistor coupled between said gate and source terminals of said third transistor whereby charges accumulated on said gate of said third enhancement transistor are discharged.

6. The circuit of claim 5, wherein said circuit includes means for tri-state operation in which said first, second, third, and fourth enhancement transistors are turned off in response to a tri-state command for high impedance operation, further including means for turning said sixth transistor on during said tri-state high impedance operation.

* * * * *